(12) United States Patent
Icoz et al.

(10) Patent No.: US 7,812,604 B2
(45) Date of Patent: Oct. 12, 2010

(54) THERMAL MANAGEMENT SYSTEM FOR COOLING A HEAT GENERATING COMPONENT OF A MAGNETIC RESONANCE IMAGING APPARATUS

(75) Inventors: Tunc Icoz, Schenectady, NY (US); Mehmet Arik, Niskayuna, NY (US); Yogen Vishwas Utturkar, Latham, NY (US); Bruce Courtney Campbell Amm, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 251 days.

(21) Appl. No.: 11/939,611

(22) Filed: Nov. 14, 2007

(65) Prior Publication Data

US 2009/0120615 A1    May 14, 2009

(51) Int. Cl.
*G01V 3/00*    (2006.01)
*A61B 5/05*    (2006.01)

(52) U.S. Cl. .................. 324/315; 324/306; 324/303; 324/318; 324/321; 324/307; 600/412; 600/411; 600/410; 600/419

(58) Field of Classification Search ......... 324/300–322; 600/407–435; 165/104.11
See application file for complete search history.

(56) References Cited

U.S. PATENT DOCUMENTS

| | | | |
|---|---|---|---|
| 3,420,634 A * | 1/1969 | Godsey .................... 436/55 |
| 6,111,412 A * | 8/2000 | Boemmel et al. .......... 324/318 |
| 6,236,207 B1 * | 5/2001 | Arz et al. .................. 324/318 |
| 6,441,614 B1 * | 8/2002 | Edelstein et al. ........... 324/318 |
| 6,774,631 B2 * | 8/2004 | Heid ......................... 324/318 |
| 6,812,705 B1 | 11/2004 | Sellers |
| 6,867,592 B2 * | 3/2005 | Gebhardt et al. ............ 324/318 |
| 6,909,283 B2 * | 6/2005 | Emeric et al. ............... 324/300 |
| 6,992,483 B1 * | 1/2006 | Emeric et al. ............... 324/300 |
| 7,015,692 B2 * | 3/2006 | Clarke et al. ................ 324/300 |
| 7,135,863 B2 | 11/2006 | Arik et al. |
| 7,140,420 B2 | 11/2006 | Arik et al. |
| 7,154,270 B2 * | 12/2006 | Arz et al. .................... 324/318 |
| 7,397,244 B2 * | 7/2008 | Cirel .......................... 324/318 |
| 2001/0033168 A1 * | 10/2001 | Heid .......................... 324/322 |
| 2003/0206018 A1 * | 11/2003 | Gebhardt et al. ............ 324/318 |
| 2004/0017195 A1 * | 1/2004 | Kassai et al. ................ 324/315 |
| 2004/0119472 A1 * | 6/2004 | Laskaris et al. ............. 324/318 |
| 2005/0030028 A1 * | 2/2005 | Clarke et al. ................ 324/318 |
| 2005/0035764 A1 * | 2/2005 | Mantone et al. ............. 324/318 |
| 2005/0093543 A1 * | 5/2005 | Arik et al. ................... 324/318 |
| 2005/0168222 A1 * | 8/2005 | Arz et al. .................... 324/318 |
| 2006/0066309 A1 * | 3/2006 | Arik et al. ................... 324/318 |
| 2006/0082370 A1 * | 4/2006 | Cirel .......................... 324/318 |
| 2009/0120615 A1 * | 5/2009 | Icoz et al. ............... 165/104.11 |

* cited by examiner

*Primary Examiner*—Brij B. Shrivastav
*Assistant Examiner*—Tiffany A Fetzner
(74) *Attorney, Agent, or Firm*—Jason K. Klindtworth (57) ABSTRACT

A thermal management system for cooling a heat generating component of a Magnetic Resonance Imaging (MRI) apparatus includes at least one heat pipe having a portion disposed proximate the heat generating component, such as a gradient coil and/or RF coil. When heat is removed from the component, a working fluid in a relatively hotter end of the heat pipe vaporizes and travels toward a relatively colder end of the heat pipe. The colder end may be operatively coupled to a heat sink for removing the heat from the colder end and increase the overall efficiency of the system. The heat pipe may be disposed along a horizontal, a vertical direction and/or along a diagonal of the heat generating component.

19 Claims, 6 Drawing Sheets

FIG.7

THERMAL MANAGEMENT SYSTEM FOR COOLING A HEAT GENERATING COMPONENT OF A MAGNETIC RESONANCE IMAGING APPARATUS

BACKGROUND

The invention relates generally to a magnetic resonance imaging (MRI) apparatus, and more particularly, to a thermal management system for cooling a heat generating component, such as a gradient coil assembly, a RF coil assembly, and the like, of the MRI apparatus.

Exemplary superconducting magnet systems operating in an AC environment include a transformer, a generator, a motor, superconducting magnet energy storage (SMES), and a magnetic resonance (MR) apparatus. Although a conventional MR magnet operates in a DC mode, some MR magnets may operate under an AC magnetic field from the gradient coils when the gradient leakage field to the magnet is high. Such an AC magnetic field generates AC losses in the magnet. An illustrative discussion of exemplary details of the MR apparatus is presented, for explanatory purposes.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received nuclear magnetic resonance (NMR) signals are digitized and processed to reconstruct the image using one of many well known reconstruction techniques.

The thermal management of the gradient coils is one of the biggest technical barriers in the development of the MR apparatus. The demand for larger patient spaces and better image qualities result in higher current densities, which lead to higher volumetric heat generation rates. The heat generated in the coils, and in particular the gradient coils, needs to be removed from the MR apparatus for safe and reliable operation of the device, as well as the comfort and safety of the patient. Excessive heat may cause rising temperatures that may soften the epoxy insulation. When a threshold temperature is reached at any location, the epoxy resin tends to melt, causing the system to lose its structural durability. Any softening in the insulation may promote electrical discharge and may cause device failure. Therefore, effective thermal management is important to keep the temperatures below acceptable limits.

One method of thermal management of MR apparatus is to provide air cooling of the gradient coils. However, air cooling is not sufficient for very high heat loads, such as the type produced in the gradient coils of the MR apparatus.

Another method of thermal management of the MR apparatus is to provide a hermetically sealed liquid cooling system. In a typical liquid cooling arrangement, the liquid is passed through liquid channels or inside the conductor for direct cooling. Typically, the cooling circuits are of serpentine scheme with either copper tubes or lengthy plastic tubes. The liquid must enter and travel axially along the MR cylinder or along the hollow conductor for proper cooling. Although liquid cooling is a feasible option for high heat loads, liquid cooling requires a large pump and manifolds to distribute coolant over the channels evenly for the best performance. In addition, this method requires complicated manifold systems to distribute the coolant flow uniformly and require multiple inlet/exit connections. These connections must be made electrically insulating to prevent forming a closed conducting loop which creates imaging artifacts. Further, the logistics of liquid cooling such as the manifold design, number of flow circuits, inlet/outlet positions for the coolant, and the like, can interfere with the design space of other MR components and increase the overall complexity, cost and reliability.

It would therefore be desirable to provide a simpler and cost effective thermal management system to maintain, for example, gradient coil temperature within a specified range regardless of the selected excitation applied, thereby increasing system reliability, enabling higher power applications for faster imaging with improved image quality, longer scanning times, while providing for the comfort and safety of the patient.

SUMMARY OF THE INVENTION

In accordance with one aspect of the invention, a thermal management system for cooling a heat generating component of a Magnetic Resonance Imaging (MRI) apparatus comprises at least one heat pipe having a first end proximate to the heat generating component of the Magnetic Resonance Imaging apparatus, wherein the first end of the at least one heat pipe removes heat from the heat generating component.

In accordance with another aspect of the invention, a thermal management system comprises at least one heat pipe having a first end and a second end, the first end of the at least one heat pipe proximate a gradient coil of a Magnetic Resonance Imaging (MRI) apparatus; and a heat sink operatively coupled to the at least one heat pipe.

In accordance with a further aspect of the invention, a thermal management system for a Magnetic Resonance Imaging (MRI) apparatus comprises at least one heat pipe, wherein the at least one heat pipe further comprises an evaporator section proximate a gradient coil of the MRI apparatus in which heat from the gradient coil assembly produces evaporation in the at least one heat pipe.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 1:
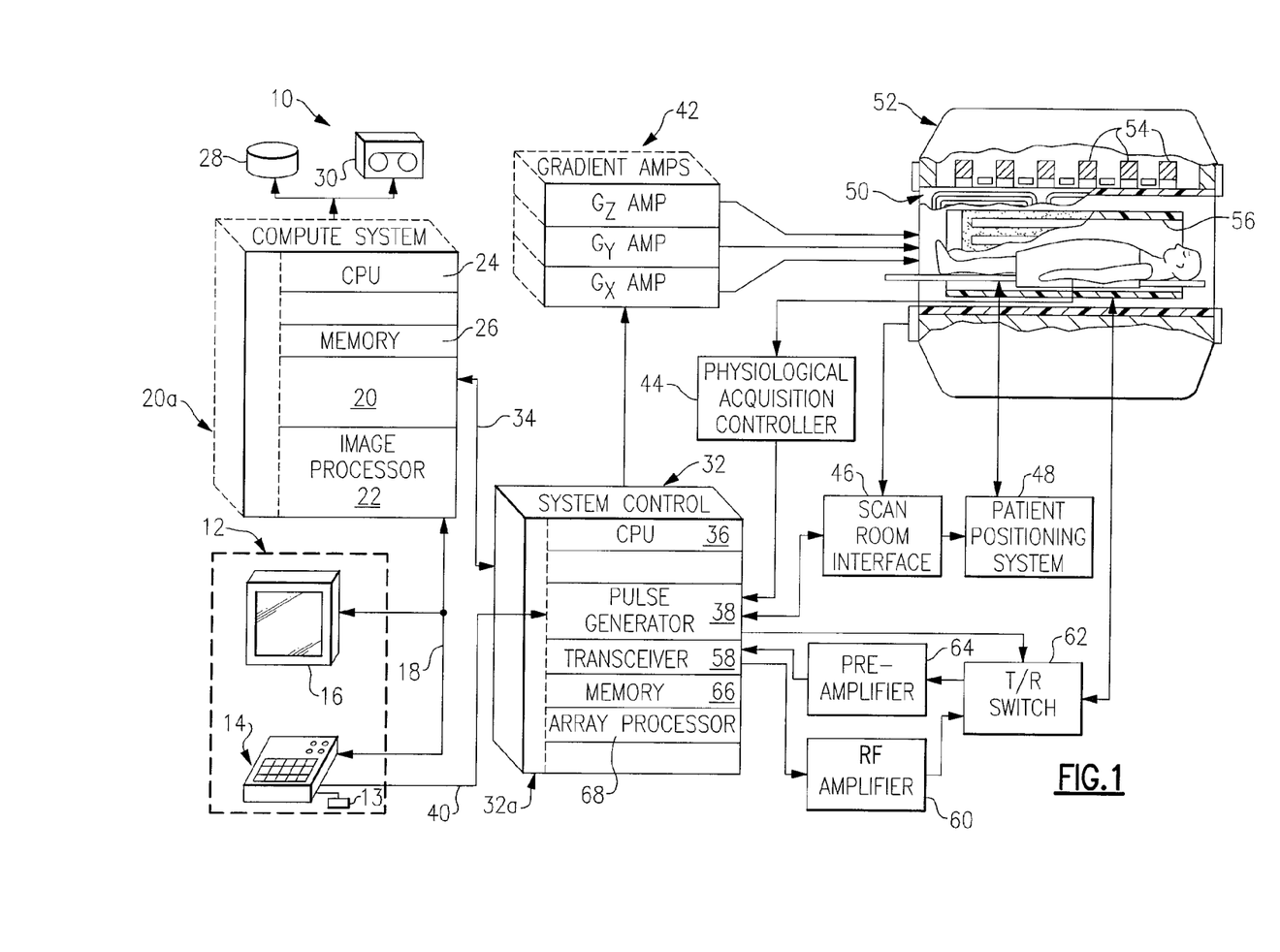
FIG. 1 is a schematic block diagram of a superconducting magnet system that in an example comprises an MR apparatus.

Referring to FIG. 1, a magnetic resonance imaging (MRI) apparatus 10 comprises a superconducting magnet systems operating in an alternating current (AC) environment. Exemplary superconducting magnet systems comprise a transformer, a generator, a motor, superconducting magnet energy storage (SMES), and/or a magnetic resonance (MR) apparatus. Although a conventional MR magnet operates in a DC mode, some MR magnets may operate under an AC magnetic field from the gradient coils when the gradient leakage field to the magnet is high. Such an AC magnetic field generates AC losses in the magnet. An illustrative discussion of exemplary details of a magnetic resonance and/or magnetic resonance imaging (MRI) apparatus and/or system are presented for explanatory purposes only.

The operation of the MR apparatus is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the radio frequency (RF) pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The magnet assembly 52 includes the gradient coil assembly 50 and a whole-body RF coil 56. In general, the gradient coil assembly 50 includes a plurality (three-dimensions) of gradient coils 54 separated by an epoxy material. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

During operation, the MR apparatus 10 consumes large amounts of electrical power. In particular, the gradient coils 54 and the RF coil 56 consume excessive amounts of power. These heat generating components, among others, generate significant heat, typically on the order of tens of kilowatts. As one would expect, excessive heat can cause system components to deteriorate or fail prematurely, and hence adversely affects reliability. Moreover, rise in temperatures causes an increase in electrical resistance and a reduction in coil currents and low coil currents affects signal generation, resulting in poor image resolution. In addition, heat can be an annoyance to a patient during the imaging process and, if excessive, could injure a patient. For this reason, there are regulations that stipulate the maximum temperature of a patient support table that effectively limits the amount of power that can be used in any MRI system.

The invention provides a system and method to improve heat removal of heat generating components, such as the gradient coil assembly 50 and RF coil 56, of the MRI apparatus 10, while maintaining internal and external temperatures below maximum operating limits, thereby enabling higher power applications for faster imaging with improved image quality as well as, allowing longer scan times for interventional procedures. In addition, the invention provides a system and method to maintain uniform temperature and eliminate hot spots in the heat generating components, and thereby the reliability of the MRI apparatus increases.

Figure 2:
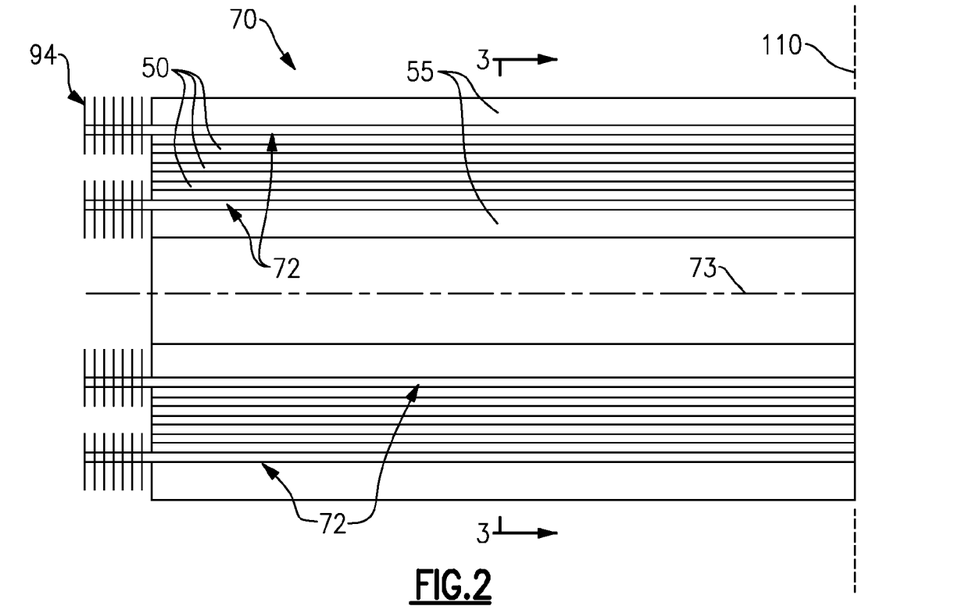
FIG. 2 is a schematic diagram of a thermal management system for dissipating heat from gradient coils of the MR apparatus according to an exemplary embodiment of the invention.
Figure 3:
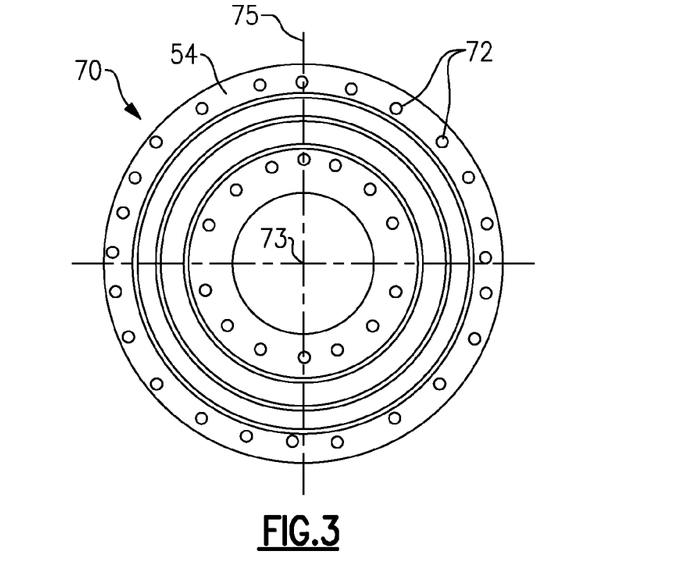
FIG. 3 is a cross-sectional view of the thermal management system taken along line 3-3 of FIG. 2.

FIGS. 2 and 3 are schematic diagrams of a thermal management system, shown generally at 70, for cooling a heat generating component of the Magnetic Resonance Imaging (MRI) apparatus 10 in accordance with an exemplary embodiment of the invention. As an illustrative embodiment, the heat generating component comprises the gradient coils 54 of the gradient coil assembly 50. However, it will be appreciated that the principles of the invention can be applied to other heat generating components of the MR apparatus 10, such as the RF coil 56, and the like. It will be appreciated that the MRI apparatus 10 is mirror symmetric about an axis 110.

In an embodiment, the thermal management system 70 comprises one or more commercially available heat pipes 72 in which a portion of the heat pipe is disposed proximate to the gradient coils 54 to assist in the dissipation of heat generated by the gradient coils 54. In an embodiment, a portion of the heat pipe 72 can be embedded and impregnated within an epoxy 55 surrounding the gradient coils 54 during the manufacture of the gradient coils 54, and thus becomes an integral part of the gradient coils 54. The heat pipes 72 may be symmetrically or asymmetrically located about a central axis 73 of the gradient coils 54. The heat pipe 72 may have any desirable cross-sectional shape. For example, the heat pipe 72 may have a circular, rectangular, square, or any other polygonal cross sectional shape. The heat pipes 72 may be spaced equally from each other, or may be spaced at unequal distances from each other. For example, the heat pipes 72 may be located in "hot spots" of the gradient coils 54, as described below. For each heat generation coil, heat pipes may be located in either lower side (lower radius) or upper side (larger radius), or a combination of any or both. Each coil may have its own heat pipe cooling scheme.

Figure 4:
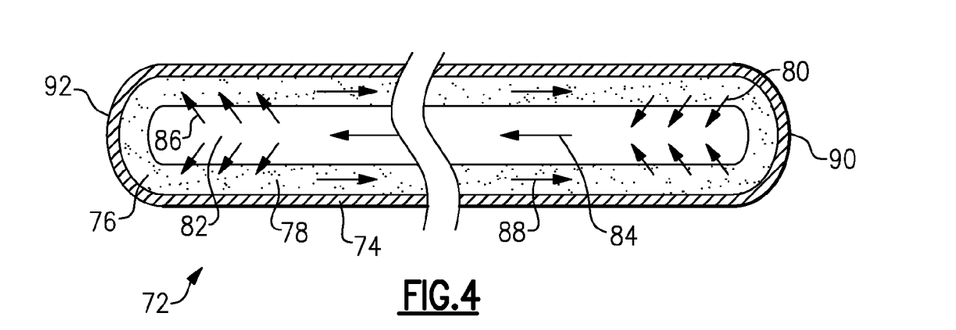
FIG. 4 is a cutaway, cross-section view of a heat pipe of the thermal management system according to an embodiment of the invention.

Referring now to FIG. 4, the heat pipe 72 is a heat transfer mechanism that can transport large quantities of heat with a very small difference in temperature between the hotter and colder interfaces. Typically, the heat pipe 72 consists of a sealed hollow tube 74. A thermo-conductive metal, such as copper, aluminum, and the like, is used to make the tube 74. The heat pipe 72 contains a relatively small quantity, for example, about 5 to 10% of a "working fluid" or coolant 76, such as water, ethanol, mercury, and the like, or any combination of fluid, with the remainder of the heat pipe 72 being filled with vapor phase of the working fluid, all other gases being excluded via hermetic sealing of the heat pipe 72.

The materials and coolant chosen depends on the excess heat and temperature conditions in which the heat pipe 72 must operate, with coolants ranging from liquid helium for extremely low temperature applications to mercury for high temperature conditions. Thus, the heat pipe 72 can be composed of one or more materials, depending on the temperature conditions in which the heat pipe 72 must operate.

It should be noted that the use a coolant 76 provides enhanced patient comfort, increased system performance in terms of resolution, a reduced size as air ducts required by prior air cooled systems can be eliminated, and greater overall system efficiency. In an embodiment, the heat pipe 72 uses some combination of ammonia, alcohol (methanol or ethanol) or water as the coolant 76. In another embodiment, the coolant 76 is a water-ethylene-glycol-mixture, a water-propylene-glycol mixture, or any heat transfer fluid.

In one embodiment, the heat pipe 72 may include a wick structure 78 on an internal side of the side walls of the tube 74 that exerts a capillary force on the liquid phase of the coolant 76. The wick structure 78 may have a non-uniform thickness to selectively adjust the amount of heat removal along the length of the heat pipe 72. This is typically a sintered metal powder or a series of grooves parallel to the tube axis, but it may in principle be any material capable of soaking up the coolant 76. If the heat pipe 72 has a continual slope with the heated end down, no wick structure 78 is needed. In this embodiment, the coolant 76 simply flows back down the heat pipe 72 due to gravitational force. This type of heat pipe is known as a Perkins Tube, after Jacob Perkins.

It will be appreciated that the heat pipe 72 may have any desirable cross-sectional shape. For example, the heat pipe 72 may have a circular or round cross-sectional shape, a substantially rectangular cross-sectional shape, a substantially oval cross-sectional shape, and the like.

In operation, the heat pipe 72 employs evaporative cooling to transfer thermal energy from one point to another by the evaporation and condensation of a working fluid or coolant. The heat pipe 72 relies on a temperature difference between the ends of the pipe, and cannot lower temperatures at either end beyond the ambient temperature (hence, heat pipes tend to equalize the temperature within the pipe).

When one end 90 of the heat pipe 72 is heated, the coolant 76 inside the pipe 72 at that end evaporates in the direction of the arrows 80 and increases the vapor pressure inside the vapor cavity 82 of the heat pipe 72. The latent heat of evaporation absorbed by the vaporization of the coolant 76 reduces the temperature at the relatively hotter end 90 of the pipe 72.

The vapor pressure over the hot liquid working fluid at the relatively hotter end 90 of the pipe 72 is higher than the equilibrium vapor pressure over condensing working fluid at the relatively colder end 92 of the pipe 72, and this pressure difference drives a rapid mass transfer to the condensing end in the direction of the arrows 84, where the excess vapor condenses in the direction of arrows 86, releases its latent heat, and warms the colder end 92 of the pipe 72. Non-condensing gases (caused by contamination for instance) in the vapor impede the gas flow and reduce the effectiveness of the heat pipe, particularly at low temperatures, where vapor pressures are low. The velocity of molecules in a gas is approximately the speed of sound and in the absence of non condensing gases, which is the upper velocity with which they could travel in the heat pipe. In practice, the speed of the vapor through the heat pipe 72 is dependent on the rate of condensation at the cold end 92.

The condensed working fluid then flows back to the hotter end of the pipe in the direction of the arrows 88 to the hotter end 90 to evaporate again and repeat the cycle. In the case of a vertically-oriented heat pipe, the coolant 76 may be moved by the force of gravity. In the case of a heat pipe that contains the wick structure 78, the coolant 76 is returned by capillary action.

When making the heat pipe 72, there is no need to create a vacuum in the pipe. One simply boils the working fluid in the heat pipe until the resulting vapor has purged the non condensing gases from the pipe and then seals the end.

An interesting property of the heat pipe 72 is the temperature over which it is effective. On first glance, it might be suspected that a heat pipe with water as the working fluid would only start to work when the hotter end reached 100° C. and the water boils resulting in the mass transfer which is the secret of a heat pipe. However, the boiling point of water is dependent on the pressure under which it is held. In an evacuated pipe (about 700 Pa pressure), water will boil right down to 0° C. Heat transfer will start, therefore, when the hotter end is warmer than the cold end. Similarly, a heat pipe with water as the working fluid can work well above 100° C.

A level of control over the total pressure in the heat pipe can be obtained by controlling the amount of working fluid. Water, for instance, expands 1600 times when it vaporizes at 1 atmosphere. If 1/1600 of the volume of a heat pipe is filled with water, when all the fluid is just vaporized, the pressure will be one atmosphere. If the safe working pressure of the pipe in question is, for example, 5 atmospheres, one could use a quantity of water equal to 5/1600 of the total volume.

The heat pipe 72 has great efficiency in transferring heat. The heat pipe 72 is actually a vastly better heat conductor than an equivalent cross-section of solid copper. Heat flows of more than 230 MW/m$^2$ have been recorded (nearly 4 times the heat flux at the surface of the sun). The main reason for the effectiveness of heat pipes is due to the evaporation and condensation of the working fluid, which requires/releases far more energy than simple temperature change. Using water as an example, the energy needed to evaporate one gram of water is equivalent to the amount of energy needed to raise the temperature of that same gram of water by 540° C. Almost all of that energy is rapidly transferred to the "cold" end when the fluid condenses there, making a very effective heat transfer system with no moving parts.

The heat pipe 72 contains no moving parts and typically requires no maintenance, though non-condensing gases that diffuse through the pipe's walls may eventually reduce the effectiveness, particularly when the working fluid's vapor pressure is low.

Figure 5:
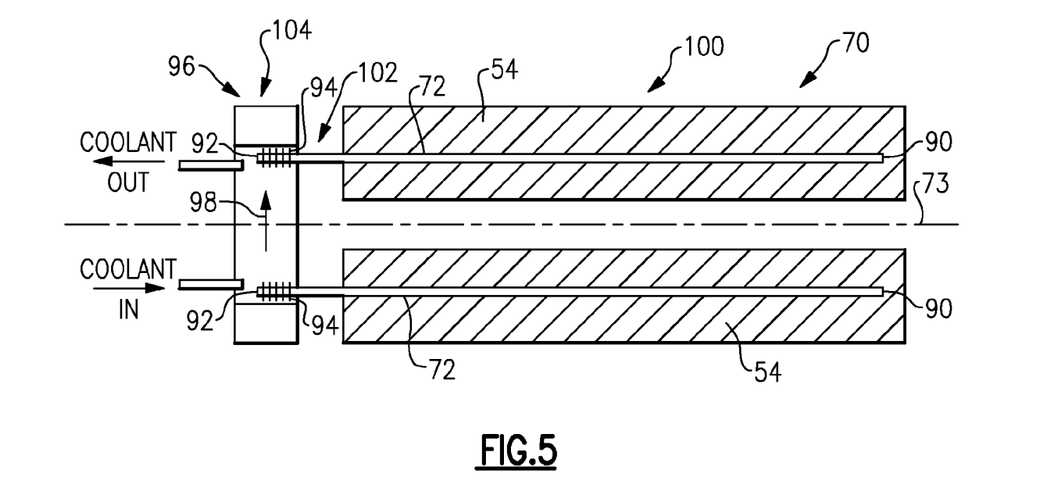
FIG. 5 is a cross-sectional view of a thermal management system with heat pipes having fins at the colder end and a manifold for cooling the fins to increase the overall effectiveness of the thermal management system according to an embodiment of the invention.
Figure 6:
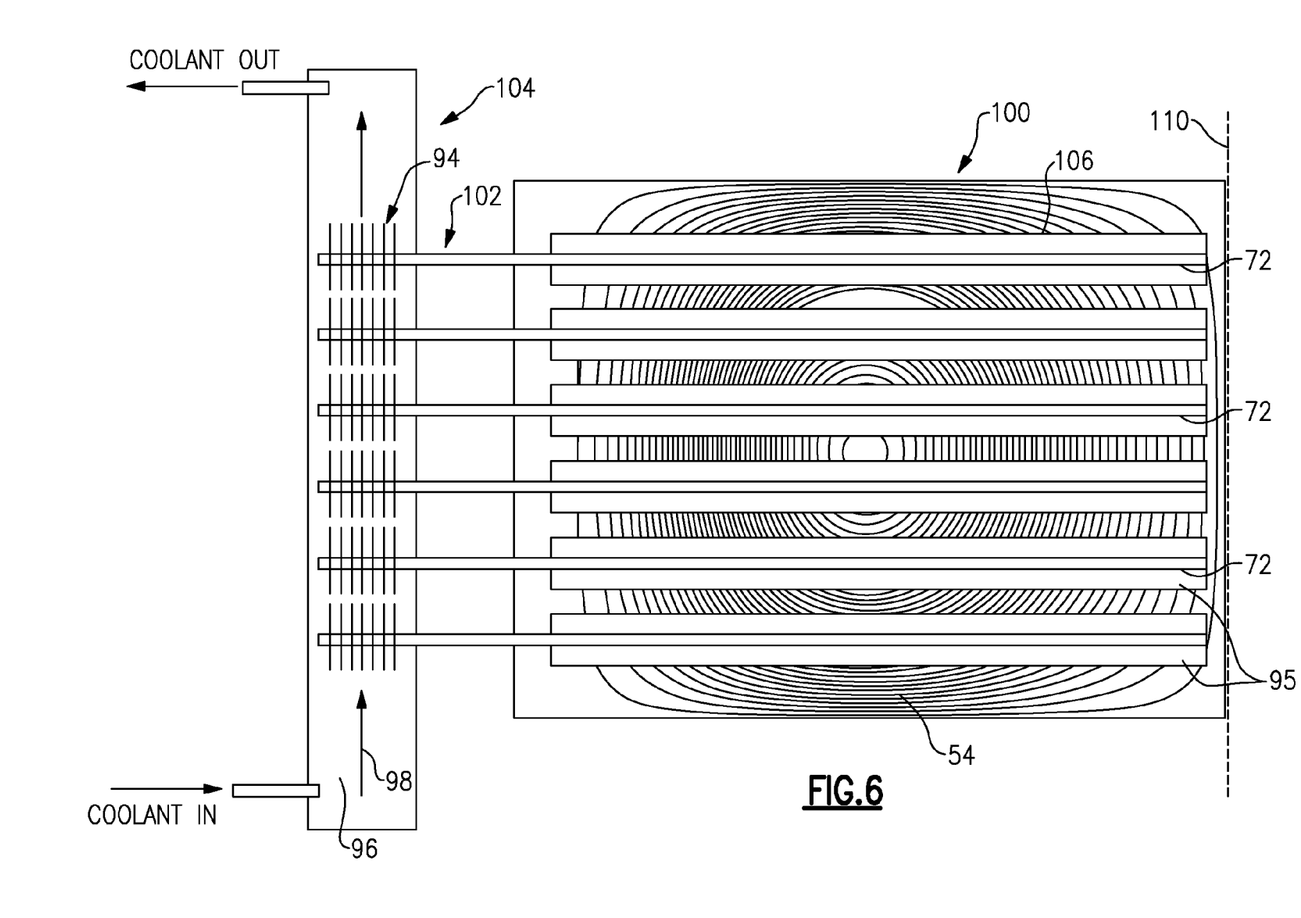
FIG. 6 is a top view of the thermal management system of FIG. 5.

Because the condensing vapor increases the temperature of the colder end 92 of the heat pipe 72, the thermal management system 70 may includes a means for removing heat from the colder end 92 of the heat pipe 72. For example, the colder end 92 of the heat pipe 72 may be operatively coupled to a heat sink, such as fins 94, and the like, as shown in FIGS. 5 and 6. The colder end 92 can be positioned within a manifold 96, which in turn, is capable of transporting a coolant that flows in the direction of the arrow 98 to remove heat from the colder end 92 of the heat pipe 72. The coolant may be any desirable fluid (a liquid, a gas, or a combination of both). A pump (not shown) may be used to force the coolant through the manifold 96. This transfer of heat from the colder end 92 by the arrangement of the heat sink, such as the fins 94 and/or the manifold 96, increases the overall heat removal effectiveness of the heat pipe 72. It will be appreciated that the invention is not limited by the means for removing heat from the colder end 92 of the heat pipe 72. For example, the heat can be removed from the colder end 92 of the heat pipe 72 by the use of a liquid or a gas.

It will be appreciated that the heat sink can also be used within the gradient coil assembly 50 to improve heat removal from the gradient coils 54. For example, the fins 94 can be operatively coupled to the heat pipe 72 by embedding the fins 94 within the epoxy 55 of the gradient coil assembly 50. In this arrangement, the fins 94 increase the heat transfer from the relatively hotter gradient coil 54 to the relatively cooler heat pipe 72, thereby increasing the heat removal efficiency of the thermal management system 70.

In an alternative embodiment, the one or more heat pipes 72 can be mounted on a substrate 95 to form a heat pipe module 106. The substrate 95 can be made of any thermally conductive material, such as metal, and the like. The thermal management system 70 may include a single heat pipe module 106 with a plurality of heat pipes 72 mounted thereto, or a plurality of heat pipe modules 106 located proximate the gradient coils 54. The fins 94 can be embedded in the substrate 95 to further enhance the heat transfer properties of the heat pipe module 106.

The thermal management system 70 shown in FIGS. 5 and 6 can be summarized in three sections: 1) a first portion of the heat pipe 72 being disposed within the gradient coil 54 to form an evaporator section 100 in which the heat from the gradient coil 54 produce evaporation in the heat pipe 72; 2) a second portion of the heat pipe 72 being disposed external to the gradient coil 54 to form an adiabatic section 102 in which there is little or no transfer of heat transfer occurs from the heat pipes 72; and 3) a third portion of the heat pipe, to form a condenser section 104 in which the vapor generated from the heat of the gradient coil 54 condenses proximate the colder end 92 of the heat pipe 72. As a result, the temperature of the colder end 92 gradually increases due to the condensation of the vapor.

To improve the heat transfer from the colder end 92 and the efficiency of the heat pipe 72, the colder end 92 may be operatively coupled to the heat sink, such as the fins 94 and/or the manifold 96. It is noted that the heat sink arrangement for the third portion of the heat pipe may lie external to the MR system (stand in air where a fan or blower is placed to forced air across the condenser section to reject heat to ambient). This greatly simplifies the noted difficulties in designing the flow circuitry and manifolds.

It will be appreciated that the magnet assembly 52 is a donut-shaped, cylindrical structure that is best described using the Cylindrical Coordinate System (r, θ, h). However, it is well-known that a position of a point, P, within the Cylindrical Coordinate System can be converted to the Cartesian Coordinate System (x, y, z) by the following equation:

$$f(x,y,z)=(r \cos \theta, r \sin \theta, h) \qquad \text{Eq. 1}$$

As described in the earlier embodiment, the heat pipes 72 are oriented substantially along a single axis (x-direction) of the MRI apparatus 10. However, the invention is not limited by the orientation of the heat pipes 72. For example, the heat pipe 72 can extend along two or more axes, for example, along the x- and y-axes, or even diagonally within the MRI apparatus 10 (r-axis).

Figure 7:
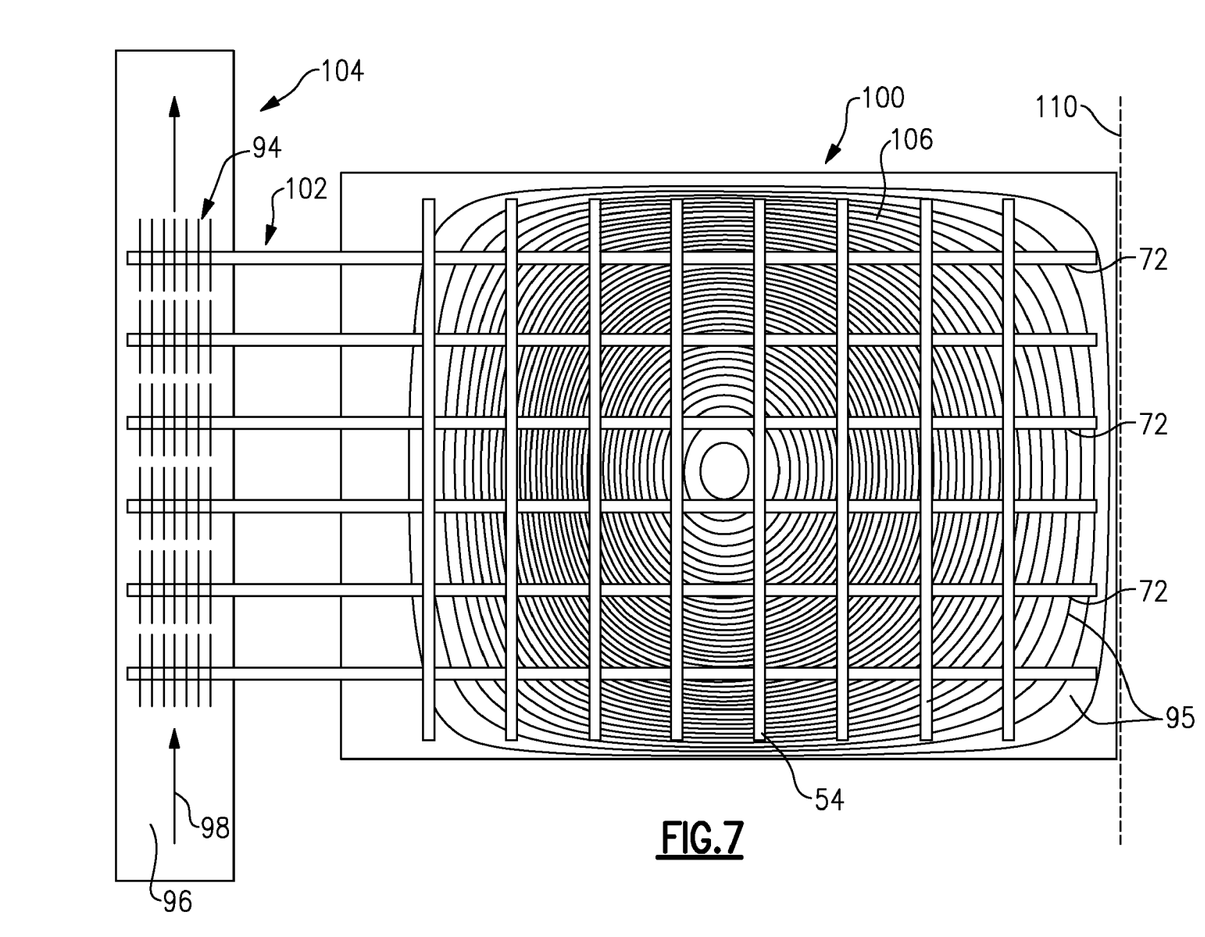
FIG. 7 is a top view of an alternative embodiment of the thermal management system with heat pipes in both the x- and y-directions.
Figure 8:
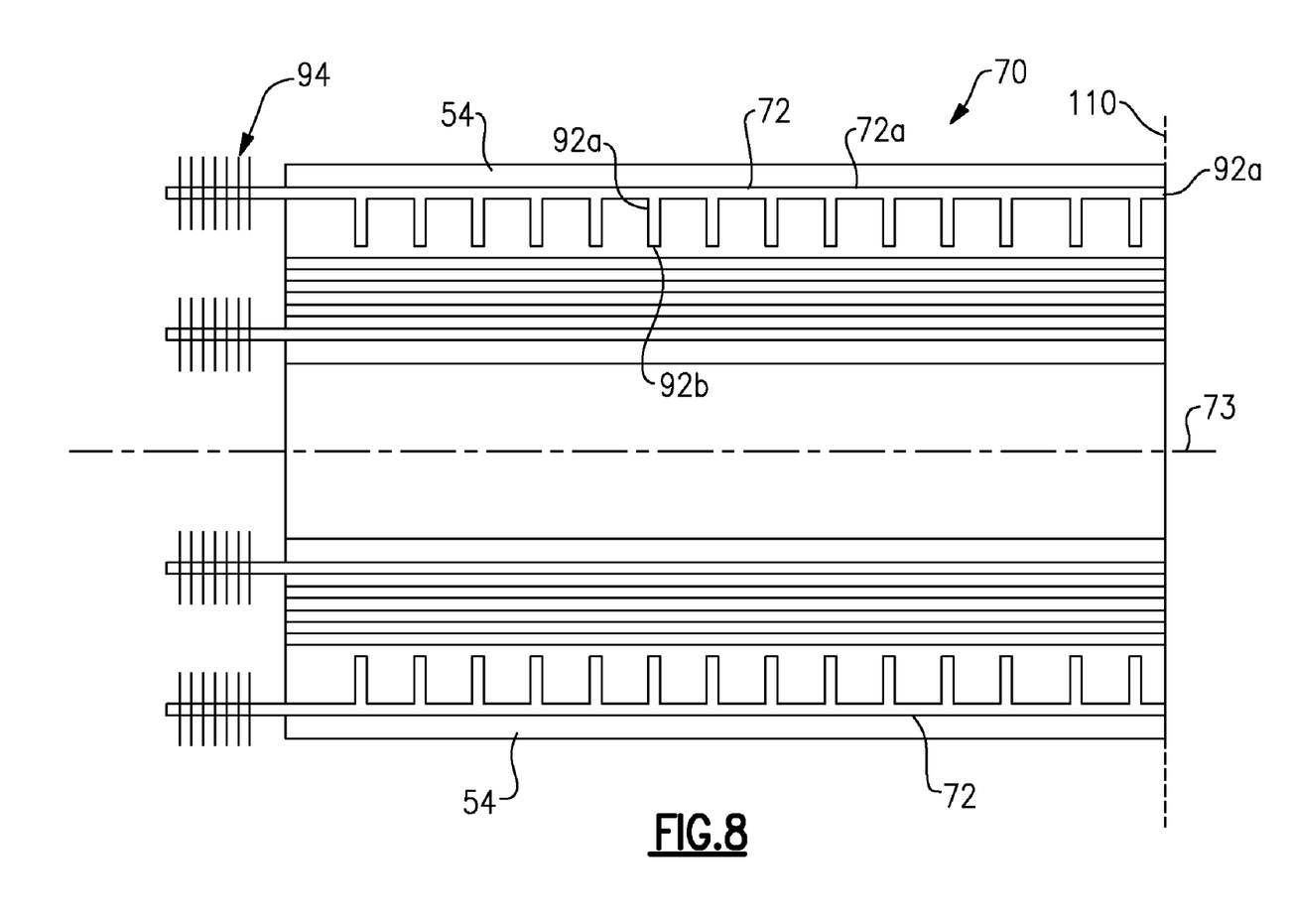
FIG. 8 is a cross-sectional view of a thermal management system with heat pipes in both the axial and radial direction (x- and z-directions) according to an embodiment of the invention.

As shown in FIG. 7, the heat pipes 72 are oriented in both the x- and y-directions of the MRI apparatus 10. As shown in FIG. 8, the heat pipes 72 are oriented in both the axial and radial (x- and z-) directions (along the horizontal axis 73 and along the vertical axis 75). In particular, the heat pipe 72 includes two sections: a first section 72a that extends axially substantially along the horizontal axis 73, and a second section 72b that extends radially substantially along the vertical axis 75. As noted above, if the heat pipe 72 has a continual slope with the heated end down, no wick structure 78 is needed, and the coolant 76 simply flows back down the heat pipe 72 due to gravitational force. Such is the case of the second section 72b in which the heated end 92b is radially inward as compared to the colder end 92a. The heat pipe arrangements of FIGS. 7 and 8 can be particularly useful in removing heat from localized "hot spots" in the gradient coil 54. It will be appreciated that the invention in not limited by the arrangement of the heat pipes in the axial and radial directions, and that the invention can be practiced by arranging the heat pipes in any desired orientation with respect to the cylindrical coordinates of the MRI apparatus.

As described above, the thermal management system 70 of the invention provides a simple, light-weight, cost effective solution for removing heat from a heat generating component, such as the gradient and RF coils 54, 56, of the MR apparatus 10. The use of one or more heat pipes provides a compact design, localized thermal management, non-uniform heat removal ability, and the lowest eddy current effects without the use of a circulating fluid as compared to conventional thermal management systems.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A thermal management system configured for cooling a heat generating component of a Magnetic Resonance Imaging (MRI) apparatus, the system comprising at least one heat pipe made of an environmentally sealed, hollow tube having a liquid coolant therein, the at least one heat pipe having a first end and a second end, the first end proximate the heat generating component of the Magnetic Resonance Imaging apparatus, the second end having a lower, cooler temperature than the first end, wherein the liquid coolant at the first end of the at least one heat pipe evaporates due to heat transfer from the heat generating component to the liquid coolant, and condenses at the second end of the at least one heat pipe, thereby removing heat from the heat generating component of the Magnetic Resonance Imaging apparatus.

2. A system of claim 1, wherein the heat generating component comprises a gradient coil of the MRI apparatus.

3. A system of claim 1, wherein the at least heat pipe is disposed substantially along one of a horizontal axis and a vertical axis of the MRI apparatus.

4. A system of claim 1, further comprising a heat sink configured for removing heat from a second end of the at least one heat pipe.

5. A system of claim 4, wherein the heat sink is disposed within a manifold having a coolant passing therethrough.

6. A system of claim 1, wherein the first end of the at least one heat pipe is embedded in an epoxy material.

7. A system of claim 1, further comprising a module made of a thermally conductive material, wherein the at least one heat pipe is mounted on the module.

8. A thermal management system, comprising:
at least one heat pipe made of an environmentally sealed, hollow tube having a liquid coolant therein, the at least one heat pipe having a first end and a second end, the first end of the at least one heat pipe proximate a gradient coil of a Magnetic Resonance Imaging (MRI) apparatus in order to remove heat from the gradient coil by evaporation of the liquid coolant into vapor at the first end and condensation of the vapor at the second end, the second end having a lower, cooler temperature than the first end; and
a heat sink operatively coupled to the at least one heat pipe.

9. A system of claim 8, wherein the at least heat pipe is disposed substantially along one of a horizontal axis and a vertical axis of the MRI apparatus.

10. A system of claim 9, wherein the heat sink comprises fins operatively coupled to the second end of the at least one heat pipe.

11. A system of claim 8, further comprising a manifold having a coolant passing therethrough.

12. A system of claim 11, wherein the heat sink is disposed within the manifold.

13. A system of claim 11, wherein the second end of the at least one heat pipe is disposed within the manifold.

14. A system of claim 8, wherein the heat sink is located proximate the gradient coil configured for removing heat therefrom.

15. A thermal management system configured for a Magnetic Resonance Imaging (MRI) apparatus comprising at least one heat pipe made of an environmentally sealed, hollow tube having a liquid coolant therein, wherein the at least one heat pipe further comprises an evaporator section proximate a gradient coil of the MRI apparatus in which heat from the gradient coil produces evaporation of the coolant within the at least one heat pipe, the latent heat of evaporation absorbed by the vaporization of the coolant, thereby reducing a temperature at the first end of the at least one heat pipe and removing heat from the gradient coil of the MRI apparatus.

16. A system of claim 15, wherein the at least one heat pipe further comprises an adiabatic section being disposed external to the gradient coil in which little or no heat transfer occurs from the coolant within the at least one heat pipe.

17. A system of claim 16, wherein the at least one heat pipe further comprises a condenser section in which the coolant is condensed within the at least one heat pipe.

18. A system of claim 15, wherein the at least heat pipe is disposed substantially along one of a horizontal axis and a vertical axis of the MRI apparatus.

19. A system of claim 15, further comprising a heat sink operatively coupled to the at least one heat pipe.

* * * * *